(12) United States Patent
Bantiles et al.

(10) Patent No.: US 10,219,394 B1
(45) Date of Patent: Feb. 26, 2019

(54) RADIATED IMMUNITY USING EMC CLIPS CONNECTED TO A BOTTOM HOUSING

(71) Applicant: Connaught Electronics Ltd., Tuam, County Galway (IE)

(72) Inventors: Sergio Bantiles, Tuam (IE); Amit Gupta, Tuam (IE); Fintan McMorrow, Tuam (IE); John Grimes, Tuam (IE); Joseph Estremera, Tuam (IE)

(73) Assignee: Connaught Electronics Ltd., Tuam, County Galway (IE)

( * ) Notice: Subject to any disclaimer, the term of this patent is extended or adjusted under 35 U.S.C. 154(b) by 0 days.

(21) Appl. No.: 16/023,444

(22) Filed: Jun. 29, 2018

(51) Int. Cl.
*H01R 13/6595* (2011.01)
*H05K 5/00* (2006.01)
*H05K 9/00* (2006.01)

(52) U.S. Cl.
CPC ....... *H05K 5/0069* (2013.01); *H01R 13/6595* (2013.01); *H05K 9/0081* (2013.01)

(58) Field of Classification Search
USPC ................................................ 361/760, 761
See application file for complete search history.

(56) References Cited

U.S. PATENT DOCUMENTS

| 8,953,335 | B2* | 2/2015 | Abe | H01L 23/36 165/80.2 |
| 2013/0077255 | A1* | 3/2013 | Abe | H01L 23/36 361/716 |

* cited by examiner

*Primary Examiner* — Andargie M Aychillhum
(74) *Attorney, Agent, or Firm* — Osha Liang LLP

(57) ABSTRACT

An apparatus for a vehicle includes an electronic device and an ECU. The electronic device includes a conductive housing that comprises a bottom portion, a PCB that comprises a top layer having circuitry, and a ground layer, the PCB located in the housing, a ground component electronically connected to the ECU and the bottom portion, at least one leg that extends through the PCB and fixes the PCB to the bottom portion, and EMC connectors that connect the circuitry to the bottom portion. At a noise frequency, when there is a noise current at a given location of the circuitry, a first noise impedance from the location to the bottom portion through the EMC connectors is less than a second noise impedance from the location to other locations of the circuitry, and less than a third noise impedance from the location to the bottom portion through the leg.

10 Claims, 4 Drawing Sheets

RADIATED IMMUNITY USING EMC CLIPS CONNECTED TO A BOTTOM HOUSING

BACKGROUND OF INVENTION

Field of the Invention

The invention relates generally to electronic devices and apparatuses used in motor vehicles or the like.

Background Art

A motor vehicle has complex electronic devices disposed in limited space. The electronic devices perform various types of functions, operate at various frequencies, and interconnect with other electronic devices. The electronic devices often have circuit boards having complex circuitries placed in a housing.

During the operation of an electronic device, there may be noise currents on the circuitry. The noise currents may be undesired frequency components generated by the electronic components of the circuitry, or may be introduced to the circuitry from electronic components outside of the electronic device. Typically, noise frequencies are considered to be frequencies undesirable or harmful to the electronic device, other devices, or the operator of the devices. Regulations may also specify certain frequency ranges as noise frequencies. The noise currents on the circuitry may interfere the normal operation of the electronic device, and may cause radiation into the surrounding space. Therefore, in order to protect the normal operation of the electronic device, reduce unwanted radiation, and comply with regulations, it is important to direct the noise currents away from the circuitry to the electronic ground.

Some solutions use screws to direct the noise currents to the bottom of the housing. The screws extend through the circuit board and fix the circuit board to the bottom of the housing. However, because of the physical limitations of the circuit board, it is usually difficult to have enough number of screws that extend through the circuit board at different locations, especially where there are critical electronic components. Some solutions use electromagnetic compatibility (EMC) springs or the like to direct the noise currents to the top of the housing. The current path in this case is relatively long, and the impedance of the current path is relatively high. As a result, the effectiveness of directing noise currents away from the circuitry is compromised.

In either case, the solutions are often inadequate for meeting the required EMC limits for radiated immunity and radiated emissions.

SUMMARY OF INVENTION

One aspect of the invention is directed to an electronic device comprising an electronically conductive housing that comprises a bottom portion of the housing; a printed circuit board (PCB) that comprises a top layer having circuitry, and a ground layer, wherein the PCB is located in the housing; an electronic ground component that is electronically connected to the bottom portion of the housing; at least one leg that extends through the PCB and fixes the PCB to the bottom portion of the housing; and a plurality of electromagnetic compatibility connectors that directly electronically connect the circuitry on the top layer to the bottom portion of the housing, wherein, at a noise frequency, when there is a noise current at a given location of the circuitry, a first noise impedance from the given location to the bottom portion of the housing through the plurality of electromagnetic compatibility connectors is less than a second noise impedance from the given location to other locations of the circuitry, and is less than a third noise impedance from the given location to the bottom portion of the housing through the at least one leg.

Another aspect of the invention is directed to an electronic apparatus used in a motor vehicle, the electronic apparatus comprising an Engine Control Unit (ECU) of the motor vehicle, and the electronic device as described above, wherein the electronic ground component of the electronic device is connected to the ECU.

Other aspects and advantages of the invention will be apparent from the following description and the appended claims.

BRIEF DESCRIPTION OF DRAWINGS

Specific embodiments will now be described in detail with reference to the accompanying figures. Like elements in the various figures are denoted by like reference numerals for consistency. Like elements may not be labeled in all figures for the sake of simplicity.

DETAILED DESCRIPTION

In the following detailed description, numerous specific details are set forth in order to provide a more thorough understanding of one or more embodiments of the invention. However, it will be apparent to one of ordinary skill in the art that the disclosure may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create a particular ordering of the elements nor to limit any element to being only a single element unless expressly disclosed, such as by the use of the terms "before," "after," "single," and other such terminology. Rather, the use of ordinal numbers is to distinguish between the elements. By way of an example, a first element is distinct from a second element, and the first element may encompass more than one element and succeed (or precede) the second element in an ordering of elements.

It is to be understood that the singular forms "a," "an," and "the" include plural referents unless the context clearly dictates otherwise. Thus, for example, reference to "a vane" includes reference to one or more of such vanes.

Terms like "approximately," "substantially," etc., mean that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

In general, embodiments of the invention relate to the addition of EMC connectors to connect circuitry in a motor vehicle to the bottom portion of a housing which may be connected to an engine control unit (ECU) of the motor vehicle, reducing the impedance between the circuitry and the electronic ground and providing shorter distance for noise currents to travel. A vehicle ECU is used to control the engine and other vehicle components' functions. The ECU is a computer with internal pre-programmed and programmable computer chips that is used to operate the engine by using input sensors and output components to control all engine functions.

Figure 1:
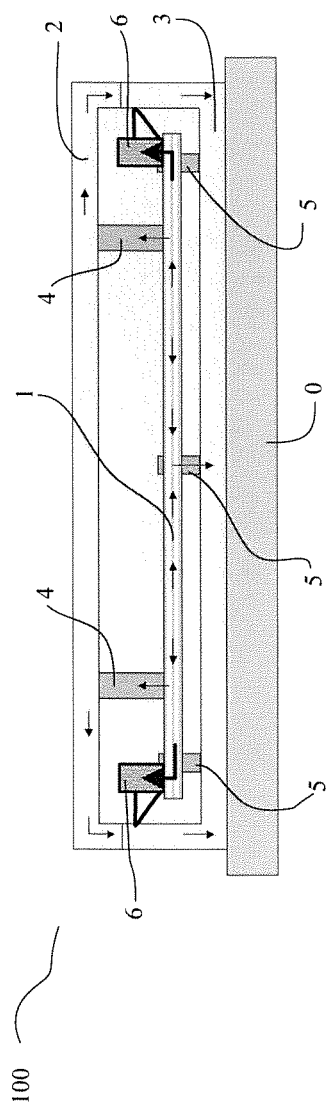
FIG. 1 is a cross-section view from the side showing the structure of the electronic device according to one or more embodiments.

FIG. 1 provides an electronic device (100) according to one or more embodiments. The electronic device (100) may be used in a motor vehicle to perform functions such as information collection, navigation, communication, air conditioning, cruise control, and driving assistance, etc.

As shown in FIG. 1, according to one or more embodiments, the electronic device (100) includes at least one printed circuit board (PCB) (1) with multiple layers. The layers of the PCB (1) include a top layer and a ground layer. The electronic device (100) also includes circuitry (not shown) that may be positioned on the top layer of the PCB.

For example, the top layer may be one surface of the PCB (1), and the ground layer may be another surface of the PCB (1). The wire(s) of the circuitry may be printed on the top layer, and the electronic components of the circuitry may be soldered to the PCB (1).

The PCB (1) may be located in a housing made of electronically conductive materials such as metal. The housing may be in a shape of a box that includes a lid, a floor, and a plurality of side walls. The housing may include a top portion (2) and a bottom portion (3). The top portion (2) and the bottom portion (3) may or may not be made of the same material, may or may not be electronically connected, and may or may not be physically attached to each other. Alternatively, the housing may be open, i.e., the housing does not include a top portion (2).

The bottom portion (3) is electronically connected to an electronic ground component (0) either via direct physical contact or via intermediate conductive components. The electronic ground component (0) may be made of electronically conductive materials such as metal. In some embodiments where the electronic device (100) is a part of an electronic apparatus used in a motor vehicle, the electronic ground component (0) may be connected to, or be a part of the Electrical Control Unit (ECU) of the motor vehicle.

Keeping with FIG. 1, the PCB (1) may be supported by one or a plurality of legs (5). The legs (5) may extend through the PCB (1) and fix the PCB (1) to the bottom portion (3). For example, the legs (5) may be screws, nails, or other connecting components. The legs (5) may be made of electronically conductive materials such as metal, to provide a possible current path between the circuitry and the bottom portion (3).

In cases where the housing includes a top portion (2), there may be one or a plurality of arms (4) that electronically connect the circuitry to the top portion (2). For example, the arms (4) may be electromagnetic compatibility springs, screws, nails, or other connecting components. The arms (4) may provide a possible current path between the circuitry and the top portion (2).

The electronic device (100) includes one or a plurality of electromagnetic compatibility (EMC) connectors (6) that electronically connect the circuitry to the bottom portion (3). The EMC connectors (6) may be made of electronically conductive materials such as metal to provide a possible current path between the circuitry and the bottom portion (3).

When there is a noise current at a given location of the circuitry, the noise current travels to the housing, and further to the electronic ground component (0) through the current path that has the lowest impedance. Because the circuitry may have noise currents at different noise frequencies, the impedance of a certain current path may vary according to the noise frequency, depending on the frequency characteristics of the electrical components on the current path.

The arrows in FIG. 1 illustrate possible current paths along which noise currents at a noise frequency travel. As shown in FIG. 1, the three legs (5) provide possible current paths to the bottom portion (3), the two arms (4) provide possible current paths to the top portion (2), and the two EMC connectors (6) provide additional possible current paths to the bottom portion (3).

The EMC connectors (6) may have variable impedance characteristics with respect to frequency. In other words, at different frequencies, the impedance of the EMC connectors (6) may be different. Typically, the EMC connectors (6) have low impedance at the noise frequency. For example, when it is determined that 400 MHz-800 MHz is a range of noise frequency, the EMC connectors (6) have low impedance at 400 MHz-800 MHz. Specifically, for noise current at locations adjacent to the EMC connectors (6) (e.g., the left end and the right end of the PCB (1) as shown in FIG. 1), the impedance from these locations to the bottom portion (3) through the EMC connectors (6) is less than the impedance from these locations to the bottom portion (3) through the legs (5), less than the impedance from these locations to the top portion (2) through the arms (4), and less than the impedance from these locations to other locations of the circuitry.

In this way, at these locations adjacent to the EMC connectors (6), noise currents may be directed to the ground component (0) through the EMC connectors (6) instead of the arms (4), the legs (5), or the other part of the circuitry. This helps reduce the presence of noise on the circuitry and noise radiation into the space, thereby improving the performance of the electronic device (100) and the compliance to radiation regulations.

In contrast, when there are noise currents at locations not adjacent to the EMC connectors (6) (e.g., near the middle of the PCB (1) as shown in FIG. 1), noise currents may travel through relatively long current paths to be directed to the ground component (0) via the arms (4) or the legs (5). This may cause interference with the components on the circuitry, and may generate unwanted radiation into the space.

Figure 2:
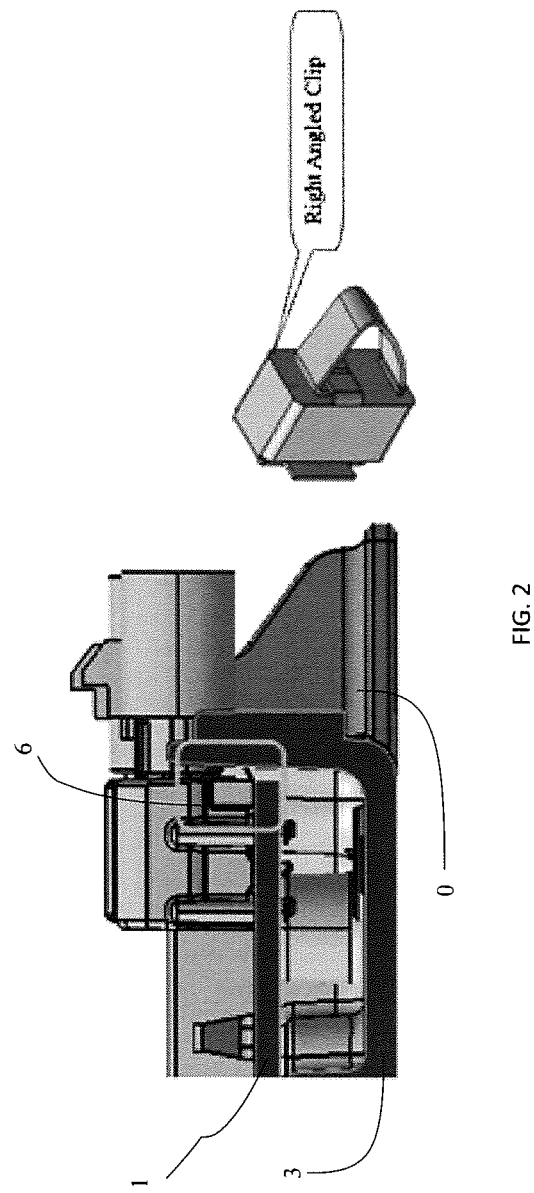
FIG. 2 is a cross-section view from the side of the electronic device according to one or more embodiments, showing more details of an EMC clip and its connection with the bottom portion.

FIG. 2 provides an enlarged 3-D view to illustrate how an EMC connector (6) may be installed to connect the PCB (1) to the bottom portion (3), according to one or more embodiments. The EMC connector (6) in this/these embodiments is a right angled clip.

As shown in FIG. 2, the EMC clip (6), highlighted in the box in FIG. 2, is installed on the top surface of the PCB (1) where the circuitry is located. One side of the clip is attached to a wall of the bottom portion (3) to establish a low impedance noise current path from the circuitry to the bottom portion (3), and further to the electrical ground component (0).

In one or more embodiments, the electronic device (100) has one or more electrical ports that are electronically connected to the circuitry. These electrical ports provide signal connection between the electronic device (100) and other devices, while often introducing noise currents. Moreover, these electrical ports are often located at the edges of the PCB (1). In this case, the EMC connectors (6) may be disposed at the edges of the PCB (1).

Figure 3:
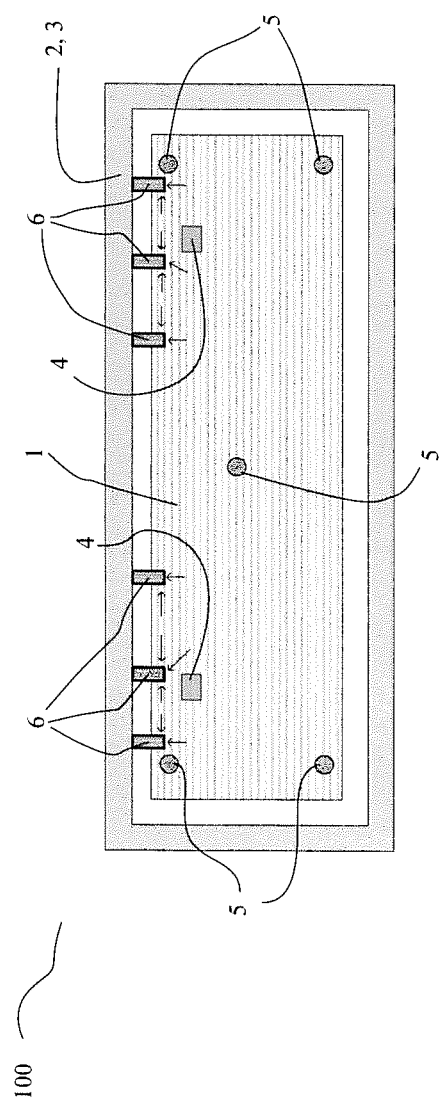
FIG. 3 is a top view showing the structure of the electronic device according to one or more embodiments.

FIG. 3 is a top view showing the structure of the electronic device (100) according to one or more embodiments. As shown in FIG. 3, the PCB (1) is surrounded by the housing which includes the bottom portion (3) and optionally the top portion (2). There is a leg (5) such as a screw at each corner of the PCB (1) and a leg (5) at the center of the PCB (1). These legs (5) fix the PCB (1) to the housing and also provide possible current paths for the noise currents. There are also two arms (4) such as EMC springs that connect the circuitry to the top portion (2) to provide possible current paths for the noise currents.

In one or more embodiments, when there are noise currents introduced by electrical ports (not shown in FIG. 3) at an edge of the PCB (1), there are one or more EMC connectors (6) disposed at the edge to provide low impedance current paths for the noise currents. In FIG. 3, there are six EMC connectors (6). Those skilled in the art will appreciate that there may be any number of EMC connectors employed in embodiments of the invention without departing from the scope of the invention.

The arrows in FIG. 3 denote the flow of noise currents introduced to the circuitry by the ports at the edge. Because the EMC connectors (6) provide low impedance current paths for the noise currents to be directed from the circuitry to the bottom portion (3), the noise is limited to the edge of the PCB (1), the majority of the circuitry is little interfered by the noise, and the radiation due to the noise currents is also largely reduced.

On the other hand, were there no EMC connectors (6), the noise currents would likely travel from the edge through a larger range of the circuitry to find a current path to the housing. The long distance travel of noise currents could disadvantageously lead to more interference with the circuitry components and also more radiation into the space.

Figure 4:
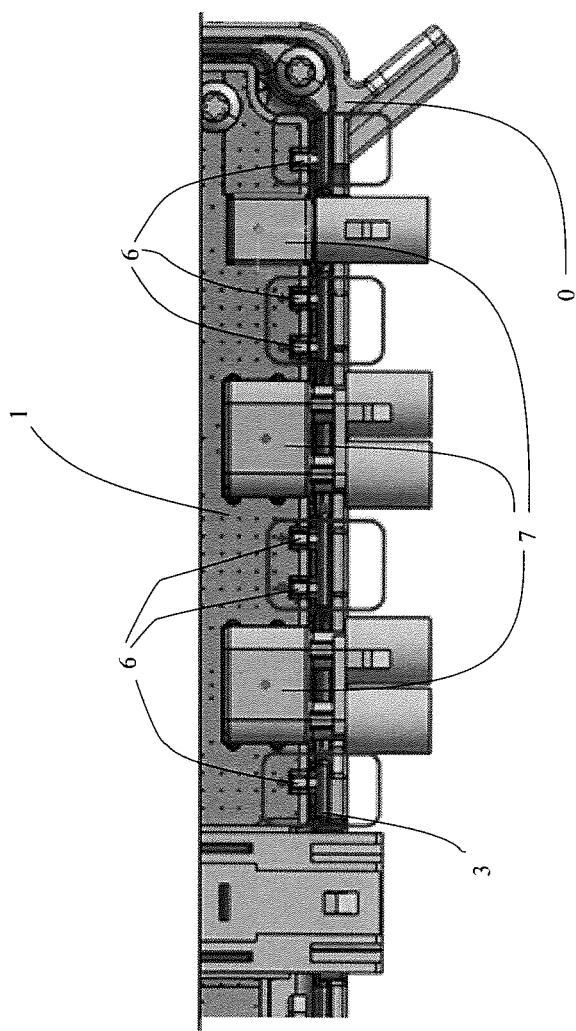
FIG. 4 is a top view of the electronic device according to one or more embodiments, where the EMC clips are installed at an edge of the circuit board.

FIG. 4 provides an enlarged 3-D view of an edge of the PCB (1) according to one or more embodiments. As shown in FIG. 4, there are three ports (7) at an edge of the PCB (1). Because these ports (7) likely introduce noise currents to the circuitry, there are also six EMC connectors (6) disposed on the same edge, as highlighted in the boxes in FIG. 4. These EMC connectors (6) provide short current paths with low impedance to direct the noise currents away from the circuitry to the bottom portion (3) and further to the electrical ground component (0).

Because the EMC connectors (6) may effectively reduce the noise on the circuitry and the radiation into the space, it may be possible to reduce the number of arms (4) such as EMC springs and legs (5) such as screws, reduce the size of the housing, and improve the performance of the electronic device (100) and other devices. Further, a direct ground path is provided from the top layer of the PCB to the lower housing, and noise current is isolated from the internal circuitry on the top layer. Due to the small size of the clips, they are easily implemented and/or retro-fitted onto the housing and PCB structures. Embodiments described above allow for float and variation within the tolerance stack and still retain contact between the PCB and the housing.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An apparatus for a motor vehicle comprising:
   an engine control unit (ECU) of the motor vehicle; and
   an electronic device that comprises:
      an electronically conductive housing that comprises a bottom portion of the housing;
      a printed circuit board (PCB) that comprises a top layer having circuitry, and a ground layer, wherein the PCB is located in the housing;
      an electronic ground component that is electronically connected to the bottom portion of the housing;
      at least one leg that extends through the PCB and fixes the PCB to the bottom portion of the housing; and
      a plurality of electromagnetic compatibility connectors that directly electronically connect the circuitry on the top layer to the bottom portion of the housing,
   wherein, at a noise frequency, when there is a noise current at a given location of the circuitry, a first noise impedance from the given location to the bottom portion of the housing through the plurality of electromagnetic compatibility connectors is less than a second noise impedance from the given location to other locations of the circuitry, and is less than a third noise impedance from the given location to the bottom portion of the housing through the at least one leg,
   wherein the electronic ground component is connected to the ECU.

2. The apparatus according to claim 1, wherein the at least one leg is a screw.

3. The apparatus according to claim 1, wherein the plurality of electromagnetic compatibility connectors are electromagnetic compatibility clips.

4. The apparatus according to claim 3, wherein the electromagnetic compatibility clips are right-angled clips.

5. The apparatus according to claim 1,
   wherein the electronically conductive housing further comprises a top portion of the housing.

6. The apparatus according to claim 5, the electronic device further comprising at least one arm,
   wherein the at least one arm electronically connects the circuitry to the top portion of the housing, and
   wherein, at the noise frequency, the first noise impedance is less than a fourth impedance from the given location to the top portion of the housing through the at least one arm.

7. The apparatus according to claim 6,
   wherein the at least one arm is an electromagnetic compatibility spring.

8. The apparatus according to claim 1, the electronic device further comprising at least one electrical port that is electronically connected to the circuitry,
   wherein the noise current is introduced from the at least one electrical port.

9. The apparatus according to claim 8, wherein the at least one electrical port is located at at least one edge of the PCB.

10. The apparatus according to claim 9, wherein the plurality of electromagnetic compatibility connectors are located at the same edge as the at least one electrical port.

* * * * *